United States Patent [19]

Lee et al.

[11] Patent Number: 4,967,165

[45] Date of Patent: Oct. 30, 1990

[54] CRYSTAL REFERENCE FOR USE IN OSCILLATOR CIRCUIT

[75] Inventors: King F. Lee, Hollywood; Frederick L. Martin, North Lauderdale, both of Fla.

[73] Assignee: Motorola, Inc., Schaumburg, Ill.

[21] Appl. No.: 310,138

[22] Filed: Feb. 14, 1989

[51] Int. Cl.⁵ .................................. H03B 5/32
[52] U.S. Cl. ........................ 331/66; 331/158; 331/176
[58] Field of Search ............ 331/66, 158, 176; 368/159

[56] References Cited

U.S. PATENT DOCUMENTS

| | | | |
|---|---|---|---|
| 3,970,818 | 7/1976 | Friedrichs | 219/210 |
| 3,978,650 | 9/1976 | Hashimoto et al. | 331/158 X |
| 4,004,133 | 1/1977 | Hannan et al. | 331/143 X |
| 4,430,596 | 2/1984 | Shanley | 310/348 |

FOREIGN PATENT DOCUMENTS 0275210  11/1988  Japan ................................. 331/158

Primary Examiner—Robert J. Pascal
Attorney, Agent, or Firm—Robert S. Babayi; Thomas G. Berry

[57] ABSTRACT

Operational characteristics of a crystal reference element (10) are measured during a testing and grading process. Once determined, information representing these operational characteristics are stored in a memory means (16) within the crystal reference element. In this way, the operational characteristics particular to each crystal reference element may be readily retrieved and used to compensate an oscillator circuit (32).

20 Claims, 3 Drawing Sheets

CRYSTAL REFERENCE FOR USE IN OSCILLATOR CIRCUIT

Technical Field

This invention relates generally to oscillators, and more specifically to crystal frequency references for such oscillators, and is particularly directed toward a crystal referenced element that includes a memory device for storing operational characteristics of the crystal.

Background Art

It is known that the resonant frequency of crystal reference elements vary over temperature. FIG. 1a illustrates the resonant frequency variation of an AT-cut crystal (expressed in parts per million (PPM)) over temperature. Those skilled in the art will appreciate that the crystal performance curve illustrated in FIG. 1a may be expressed mathematically by the following equation:

$$f(T) = fo + C1(T-To) + C3(T-To)^3$$

where
- T is the temperature
- f(T) is the resonant frequency of the crystal at temperature T, and
- fo is the resonant frequency of the crystal at temperature To.

As can be seen, the performance over a temperature range of interest (−5C to 60C) is substantially linear, and is centered around a temperature To (25C).

As is known, the first order coefficient (C1) of equation (1) varies such that each crystal must be separately characterized to determine its performance over temperature. The effect of variations of the first order coefficient causes the curve of FIG. 1a to be rotated about the center point To. Accordingly, it is customary to sort or "grade" crystals into one or more groups having different operational ranges over temperature. One such selection is illustrate in FIG. 1b. As can be seen, the variations of the first order coefficient of equation 1 have been separated in three groups: 5–10 PPM; 10–15 PPM; and 15–20 PPM.

When designing an oscillator circuit, it is customary to include a compensation circuit to maintain the oscillator's output frequency over temperature. In a manufacturing environment, the compensation circuit must be manually adjusted (or optimized) depending upon the "grading" of the crystal element. This practice is both laborious and highly susceptible to human error. Improper adjustments to the compensation circuit due to errors in crystal grading process or in the optimization of the compensation circuit may lead to erratic or degraded output frequency stability of the oscillator circuit as the ambient temperature varies. Accordingly, a need exists for a simple crystal compensation process that is immune to the human errors typified by current manufacturing processes.

Summary of the Invention

Accordingly, it is an object of the present invention to provide a crystal reference element suitable for use in an automated compensation scheme.

It is another object of present invention to provide oscillator circuit capable of automatic compensation to correct for the operational variations of crystal reference over temperature.

Briefly, according to the invention, certain operational characteristics of a crystal reference element are measured during a testing and grading process. Once determined, information representing these operational characteristics are stored in a memory means within the crystal reference element. In this way, the operational characteristics particular to each crystal reference element may be readily retrieved and used to compensate an oscillator circuit.

Detailed Description of the Preferred Embodiment

Figure 1A:
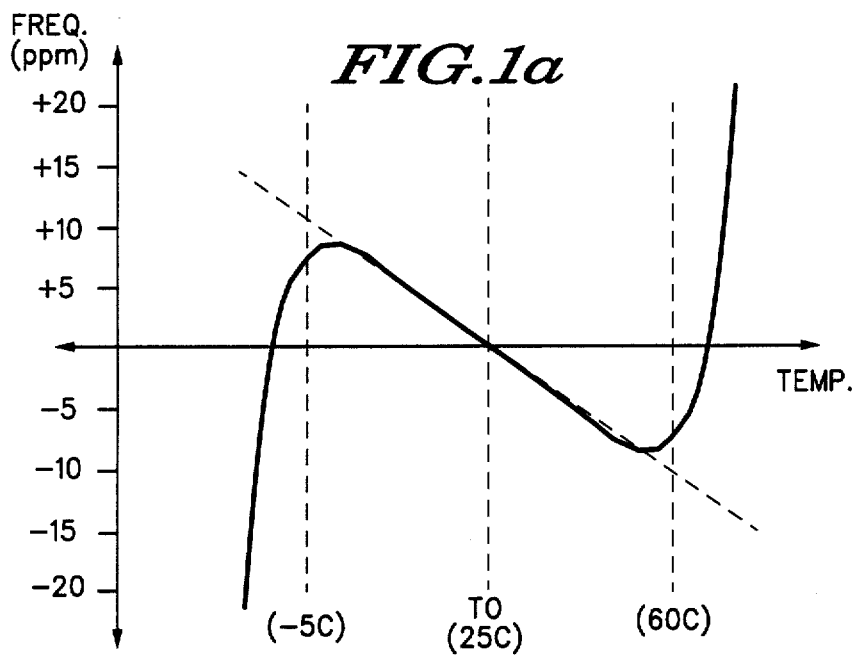
FIG. 1a is an illustration of the temperature characteristic of an AT-cut crystal.
Figure 1B:
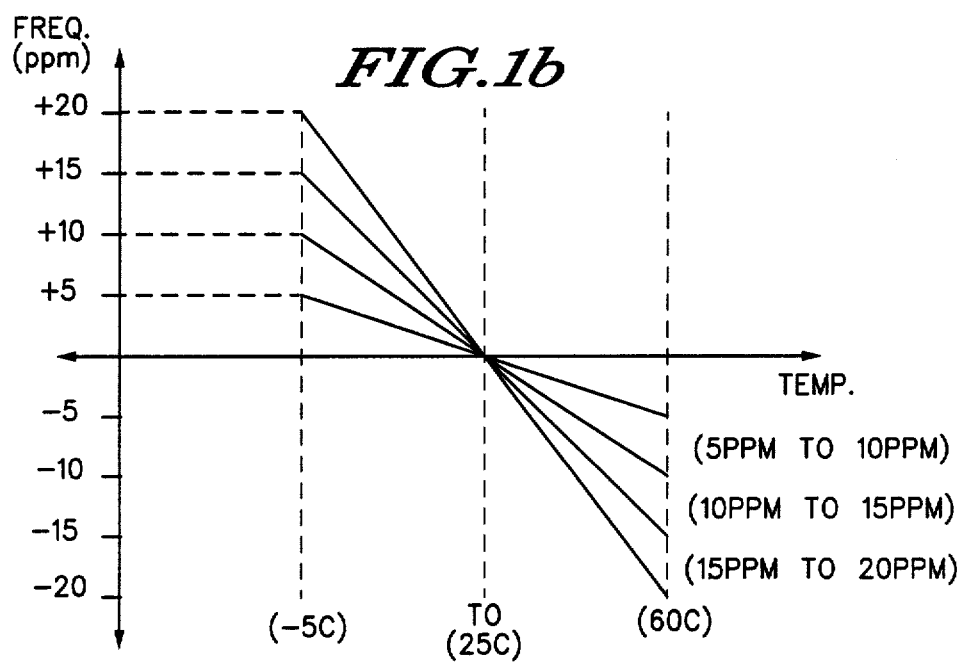
FIG. 1b illustrates a typical crystal temperature grading selection.
Figure 2A:
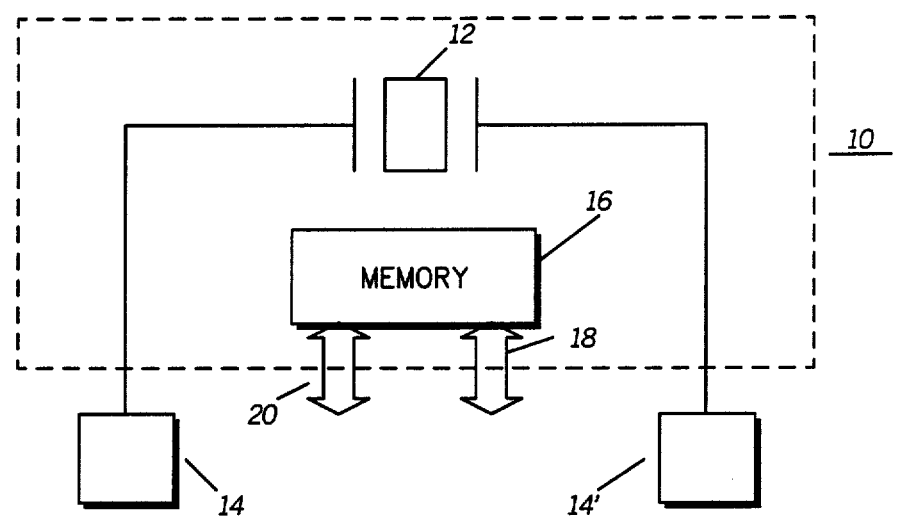
FIG. 2a is a block diagram of a preferred embodiment of the present invention.

Referring to FIG. 2a, there is shown a crystal reference element 10 in accordance with present invention. The crystal element 10 comprises a crystal 12, which may be an AT-cut crystal. Electrical connection to each side of the crystal 12 may be made by terminals 14 and 14' which facilitate coupling to an external circuit. Also included within the crystal element 10 is a storage means 16 which may be a programmable read only memory or other suitable semiconductor memory device.

During a testing and grading process, test and measurement equipment are coupled to the terminals 14 and 14' to determine various operational characteristics of the crystal 12. One such characteristic comprises the crystal's operational performance over a predetermined temperature range. According to the invention, the test equipment (not shown) is capable of storing information representing the measured operational characteristics in the storage means 16 via an address bus 20 and a data bus 18 as is known in the computing arts. In this way, the information may be later retrieved from the crystal reference element 10 and used to compensate the performance of an oscillator circuit.

Figure 2B:
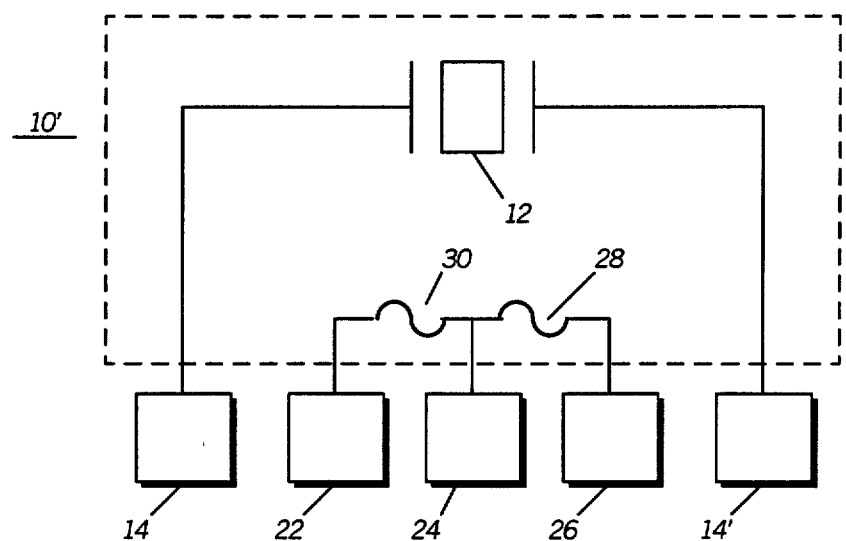
FIG. 2b is a block diagram of another preferred embodiment of present invention.

Referring to FIG. 2b another embodiment of a crystal reference element is shown. The crystal element 10' represents a simpler and more cost effective approach of storing information representing the operational characteristics of the crystal 12. As can be seen, the crystal reference 10' has been provided with three additional terminals 22, 24 and 26. A fusible link 30 is disposed between terminals 22 and 24. Similarly, another fusible link 28 is disposed between terminals 24 and 26. Those skilled in the art will appreciate that fusible links 28 and 30 may represent two binary bits, from which four distinct states may be distinguished. According to the invention, the preferred arrangement of the four possible states are illustrated in Table 1.

TABLE 1

| LINK 28 | LINK 30 | STATE |
|---------|---------|-------|
| closed | closed | out of acceptable range |
| closed | open | 5–10 PPM |
| open | closed | 10–15 PPM |

TABLE 1-continued

| LINK 28 | LINK 30 | STATE |
|---------|---------|-------|
| open | open | 15-20 PPM |

During the testing and grading process, test and measurement equipment are coupled to the terminals 14 and 14' to determine various operational characteristics (such as the temperature performance) of the crystal 12. According to the invention, the test equipment is capable of "blowing" (or opening) the fusible links 28 and 30 in accordance with the state descriptions of Table 1 so as to grade (or group) crystal reference elements. In this way, the condition of the fusible links 28 and 30 may be determined and the information used to compensate the performance of an oscillator circuit.

Figure 3:
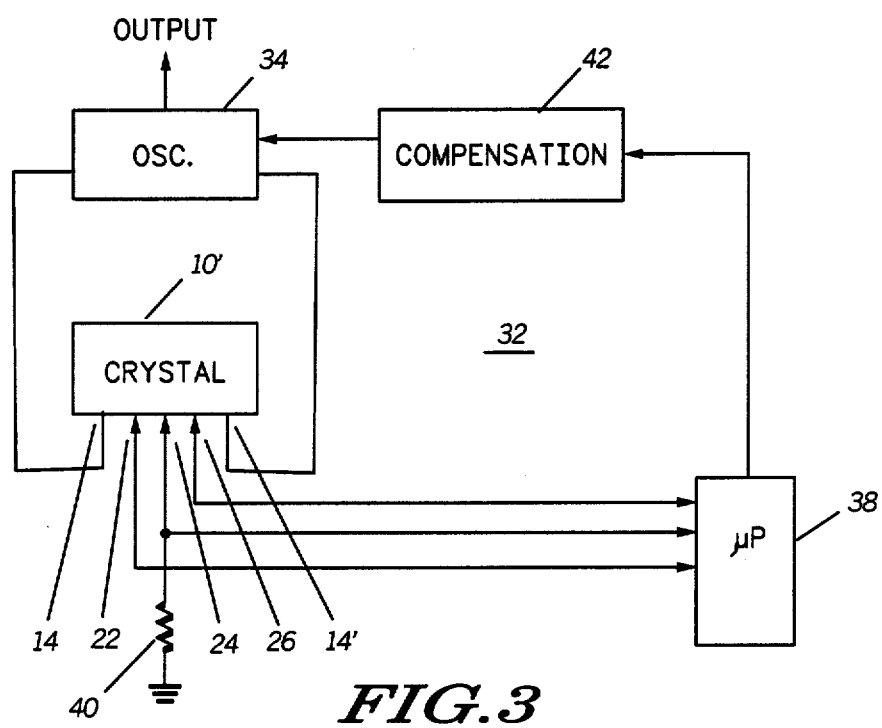
FIG. 3 is a block diagram of an oscillator circuit in accordance with present invention.

Referring to FIG. 3, a temperature compensated oscillator circuit 32 is shown in accordance with the present invention. The oscillator circuit 32 includes an oscillator 34, which may comprise a voltage controlled crystal oscillator (VCXO). A crystal element 10' is coupled to the oscillator 34 to control the output frequency of the oscillator circuit 32. According to the invention, a controller 38 is coupled to the terminals 22-26 of the crystal element 10'. Preferably the controller 38 comprises a microcomputer, microcontroller or microprocessor manufactured by Motorola, Inc., or their functional equivalence. By placing a logic 1 at terminal 22 and detecting the presence or absence of a logic 1 at terminal 24, the controller 38 may determine whether the fusible link 30 has been opened during the testing and grading process. In a similar manner the controller 38 may determine whether the fusible link 28 has been blown by placing a logic 1 at terminal 26 and detecting its presence or absence at terminal 24. A pull down resistor 40 is coupled to terminal 24 to provide a logical 0 reference should either of the fusible links 28 or 30 be open. In this way, the controller 38 may determine the operational characteristics of the crystal reference element 10', and adjust the performance of oscillator circuit 32 by controlling a compensation circuit 42. Accordingly, the present invention provides automatic compensation of the oscillator circuit 32. Of course, the crystal element 10' could be replaced by crystal element 10 of FIG. 2a provided that the address bus 20 and the data bus 18 are suitably coupled to the controller 38 so that the information within the memory 16 may be examined.

What is claimed is:

1. A reference element for use in an oscillator, comprising:
   a resonant circuit positioned in a housing; and
   means for permanently storing information within said housing representing predetermined operational characteristics of said resonant circuit.

2. The device of claim 1, wherein said resonant circuit comprises a crystal.

3. The device of claim 2, wherein said crystal comprises a AT-cut crystal.

4. A reference element for use in an oscillator, comprising: a resonant circuit; and means for storing information representing operational characteristics of said resonant circuit, wherein said means for storing information comprises at least a fusible link.

5. The device of claim 4, wherein said fusible links are fuses.

6. The device of claim 1, wherein said means for storing information comprises at least one semiconductor storage means.

7. The device of claim 6, wherein said semiconductor storage mean is a programmable read only memory.

8. A device for providing a reference signal, comprising:
   a resonant circuit positioned in a housing having a predetermined resonant frequency range over a predetermined temperature range; and
   means for permanently storing information within said housing representing said predetermined resonant frequency range.

9. The device of claim 8, wherein said resonant circuit comprises a crystal.

10. A device for providing a reference signal, comprising:
    a resonant circuit having a predetermined resonant frequency range over a predetermined temperature range;
    and means for storing information representing said predetermined resonant frequency range,
    wherein said means for storing information comprises at least two fusible links.

11. The device of claim 8, wherein said memory means comprises at least one semiconductor storage means.

12. An oscillator circuit for providing an output signal, comprising:
    a reference element, comprising:
       a crystal element;
       means for storing information representing operational characteristics of said crystal element;
    oscillating means, coupled to said reference element, for providing said output signal;
    compensation means, coupled to said oscillating means, for maintaining said output signal under varying operational conditions;
    controller means coupled to said storage means for examining said information representing said operational characteristics and for controlling said compensation means in response thereto.

13. The oscillator of claim 12, wherein said means for storing information comprise at least two fusible links.

14. The oscillator of claim 12, wherein said memory means comprises at least one semiconductor storage means.

15. The oscillator of claim 12, wherein said controller mean comprise a microprocessor.

16. The oscillator of claim 12, wherein said oscillating means comprise a voltage controlled crystal oscillator.

17. An oscillator circuit for providing an output signal over a predetermined temperature range, comprising:
    a reference element, comprising:
       a crystal element having a predetermined resonant frequency range over a predetermined temperature range;
       means for storing information representing said predetermined resonant frequency range; oscillating means, coupled to said reference element, for providing said output signal;
    compensation means, coupled to said oscillating means, for maintaining said output signal within a predetermined frequency range over the predetermined temperature range;
    controller means coupled to said storage means for examining said information representing said predetermined resonant frequency range and for controlling said compensation means in response thereto.

18. The oscillator of claim 17, wherein said means for storing information comprise at least two fusible links.

19. The oscillator of claim 17, wherein said memory means comprises at least one semiconductor storage means.

20. The oscillator of claim 18, wherein said controller mean comprises a microprocessor.

* * * * *